United States Patent
Sasaki et al.

[11] Patent Number: 6,063,228
[45] Date of Patent: May 16, 2000

[54] METHOD AND APPARATUS FOR STICKING A FILM TO A LEAD FRAME

[75] Inventors: Toshi Sasaki; Teruyuki Watahiki; Takaharu Yonemoto, all of Ibaraki, Japan

[73] Assignee: Hitachi Cable, Ltd., Tokyo, Japan

[21] Appl. No.: 08/636,443

[22] Filed: Apr. 23, 1996

[51] Int. Cl.[7] .................................................. B32B 31/00
[52] U.S. Cl. ...................... 156/261; 156/518; 156/583.1; 156/264; 156/265; 83/690; 83/31; 83/684; 83/685; 83/686
[58] Field of Search ................................. 156/518, 261, 156/583.1, 264, 521, 265, 270, 299; 83/690, 31, 684, 685, 686

[56] References Cited

U.S. PATENT DOCUMENTS 2,568,152  9/1951  Hermann ..................................... 83/690
3,355,340  11/1967  Calvert et al. .......................... 156/261
5,458,717  10/1995  Kurita ....................................... 83/690

FOREIGN PATENT DOCUMENTS 6-334110  12/1994  Japan .............................. H01L 23/50

*Primary Examiner*—Curtis Mayes
*Assistant Examiner*—Linda L. Gray
*Attorney, Agent, or Firm*—McDermott, Will & Emery

[57] ABSTRACT

An apparatus for sticking a film to a lead frame has a punch moving up and down for punching a film, a die for placing the film to be punched, and a heating plate for heating a lead frame. A punched film with a predetermined shape is applied on the lead frame and thermally compressed and adhesively attached on a lead portion of the lead frame. The die is additionally provided with a buffer layer on the top plane of the die for relaxing compressing stress but increasing tensile stress put to the film at the punching step so that a punched film is prevented from producing cracks on the cutting end thereof.

6 Claims, 3 Drawing Sheets

METHOD AND APPARATUS FOR STICKING A FILM TO A LEAD FRAME

BACKGROUND OF THE INVENTION

This invention relates to a method and an apparatus for sticking a film to a lead frame, and more particularly to, a method and an apparatus for sticking a film to a lead frame by which a punched film is prevented from creating burrs before sticking to the lead frame.

In general, a lead frame, on which an IC or LSI chip is attached, are fabricated by sticking a strip of film to a tip portion of leads of the lead frame so as to keep them from a position level difference or a position shift of the tip portion thereof. In an LOC (Lead on Chip) type lead frame, a film having thermally activating adhesive layers on the both surface thereof is commonly used for sticking the leads of the lead frame on the chip.

In a conventional method for sticking a film to a lead frame, a film is punched to provide a punched film having a predetermined shape by using a punch and a die cooperating with each other. The punched film is applied on a bead frame which is heated on a heating plate. Thus, the punched film is thermally compressed and adhesively attached on a lead portion of the lead frame.

In the conventional method for sticking a film to a lead frame, however, there is a disadvantage in that burrs, such as fiber-like burrs or tiny chips, may occur on a cutting end of the punched film, because compressive stress is given to the film by the shearing movement of the punch and the die, thereby a crack at the cutting end is created and may results in such burrs. If such punched films with burrs are stick to a lead frame, burrs may blow off from the film and stick to a fine tip portion of the lead of the lead frame, thereby resulting in serious defect in wire-bonding performance.

SUMMARY OF THE INVENTION

Accordingly, it is an object of the invention to provide a method and an apparatus for sticking a film to a lead frame by which a punched film can be prevented from creating burrs.

It is a further object of the invention to provide a method and an apparatus for sticking a film to a lead frame by which a wire-bonding defect caused by burrs is eliminated.

According to the first feature of the invention, a method for sticking a film to a lead frame, comprises the steps of:
punching a film to provide a punched film by a punch;
applying the punched film on a lead frame heated on a heating plate; and
compressing the punched film on the lead frame on the heating plate by the punch, the punched film being stuck to said lead frame;
wherein the punching step is carried out together with a step of relaxing compressive stress added to the film and increasing tensile stress by a buffer layer provided on the die.

According to the second feature of the invention, an apparatus for sticking a film to a lead frame, comprises:
a punch moving up and down for punching a film in a predetermined shape, thereby providing a punched film;
a die for placing the film thereon to be punched cooperatively with the punch; and a heating plate for heating a lead frame whereby the punched film is stuck to the lead frame;
wherein the die is provided with a buffer layer thereon for placing the film to be punched, the buffer layer having an aperture for the punch.

BRIEF DESCRIPTION OF THE DRAWINGS

The invention will be explained in more detailed in conjunction with the appended drawings, wherein.

DESCRIPTION OF THE PREFERRED EMBODIMENTS

Before explaining a method and an apparatus for sticking a film to a lead frame in the first preferred embodiment, the aforementioned conventional method and apparatus will be explained in FIGS. 1 and 2.

Figure 1:
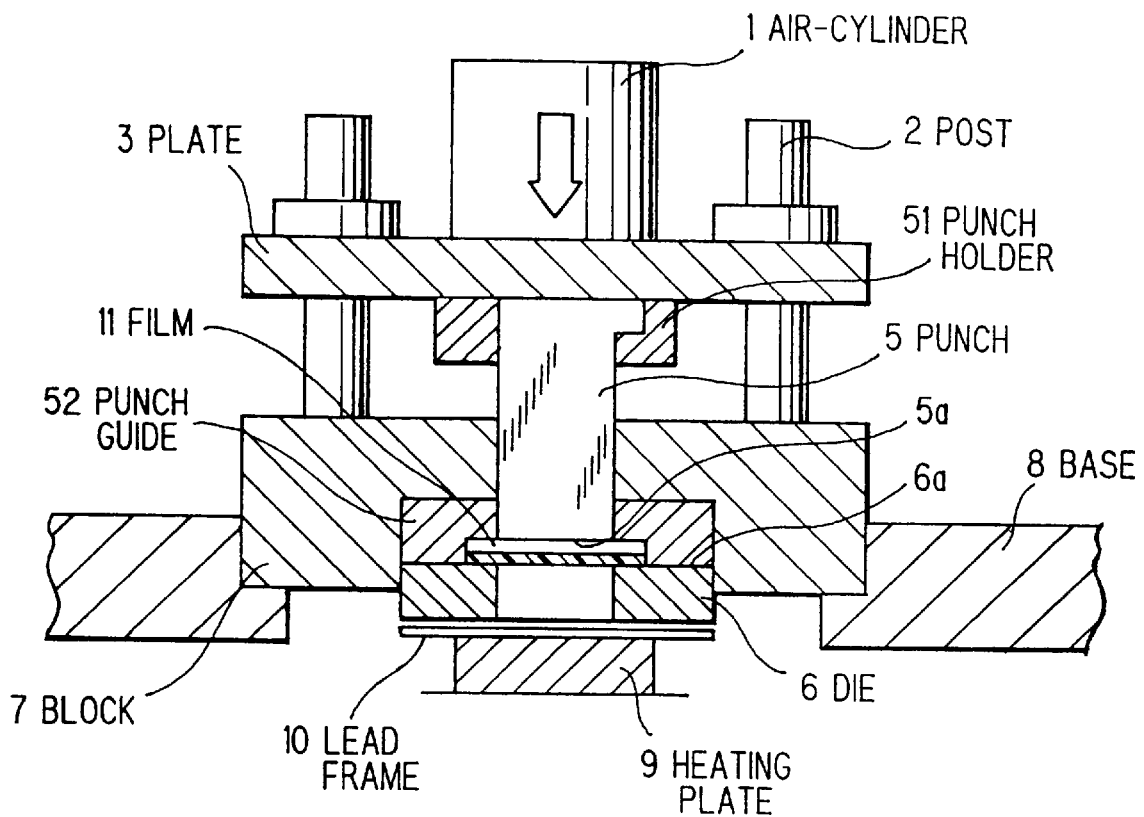
FIG. 1 is a cross-sectional view showing a conventional apparatus for sticking a film to a lead frame.
Figure 2:
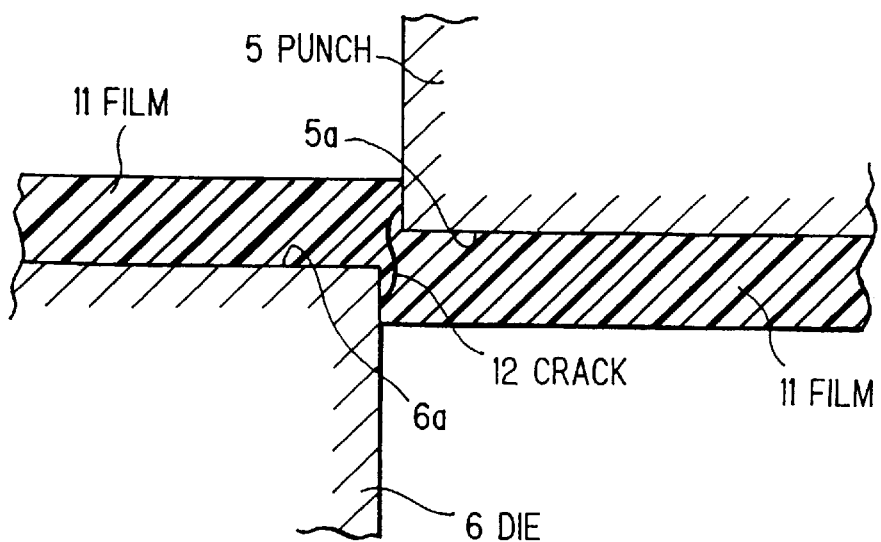
FIG. 2 is an expanded explanatory view showing a film-punching operation by a punch and a die in FIG. 1.

FIG. 1 shows the first conventional apparatus for stacking a film to a lead frame. The apparatus comprises an air-cylinder 1 for vertically moving a plate 3 up and down along the axis of the posts 2 passing through the plate 3, a punch 5 for punching a film 11 mechanically attached to the plate 3 by a punching holder 51, a punch guide 52 for guiding the punch 5 in an appropriate position for punching, a die 6 for placing a film 11 to be punched thereon, and a heating plate 9 for heating a lead frame 10 thereon. A block 7, by which the die 6 and the punch guide 52 are held, is set on a base 8.

In operation, a film 11 is transferred on a top plane 6a of the die 6 by the transfer apparatus (not shown), and at the same time the lead frame 10 is also transferred on the heating plate 9. Then the punch 5 is moved down to punch the film 11 so as to provide a punched film having a predetermined shape by cooperating with the die 6. The punched film is stuck to a tip plane 5a of the punch 5 and applied on the lead frame 11 which is heated on the heating plate 9. Thus, the punched film is thermally compressed and adhesively attached on a lead portion or the lead frame 10.

In the conventional apparatus for sticking a film to a lead frame, compressive stress is given to the film 11 by the shearing movement of the tip plane 5a of the punch 5 and the top plane 6a of the die 6. Consequently, it sometimes causes to create a crack 12 at the cutting end of the film 11, as shown in FIG. 2. As a result, the disadvantage, as described before, in which burrs, such as fiber-like burrs or tiny chips, may occur on a cutting end of the punched film is observed, thus resulting in serious defect in wire-bonding performance.

Next, an apparatus for sticking a film to a lead frame in the first preferred embodiment will be explained in FIG. 3, wherein like parts are indicated by like reference numerals as used in FIG. 1.

In the first preferred embodiment of the invention, the die 6 is additionally provided with a buffer layer 4 on the top plane 6a thereof. The buffer layer 4 is provided with an aperture 4A having the same size as that of the die 6, and is made of, for example, aluminum to relax compressing stress but increase tensile stress put to the film 11 placed thereon at the punching step, so that a punched film is prevented from producing cracks on the cutting end thereof.

Figure 3:
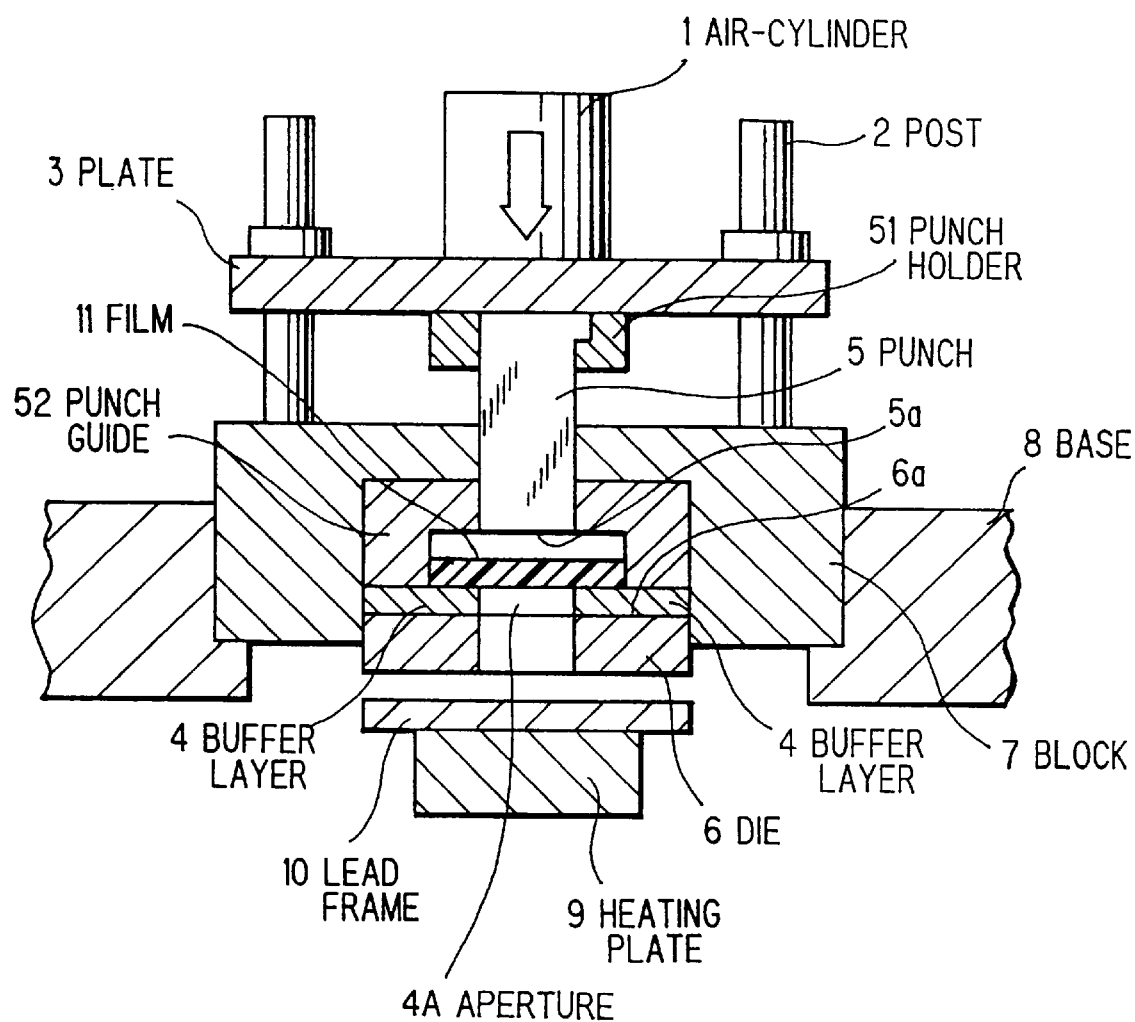
FIG. 3 is a cross-sectional view showing an apparatus for sticking a film to a lead frame in a first preferred embodiment according to the invention.
Figure 4:
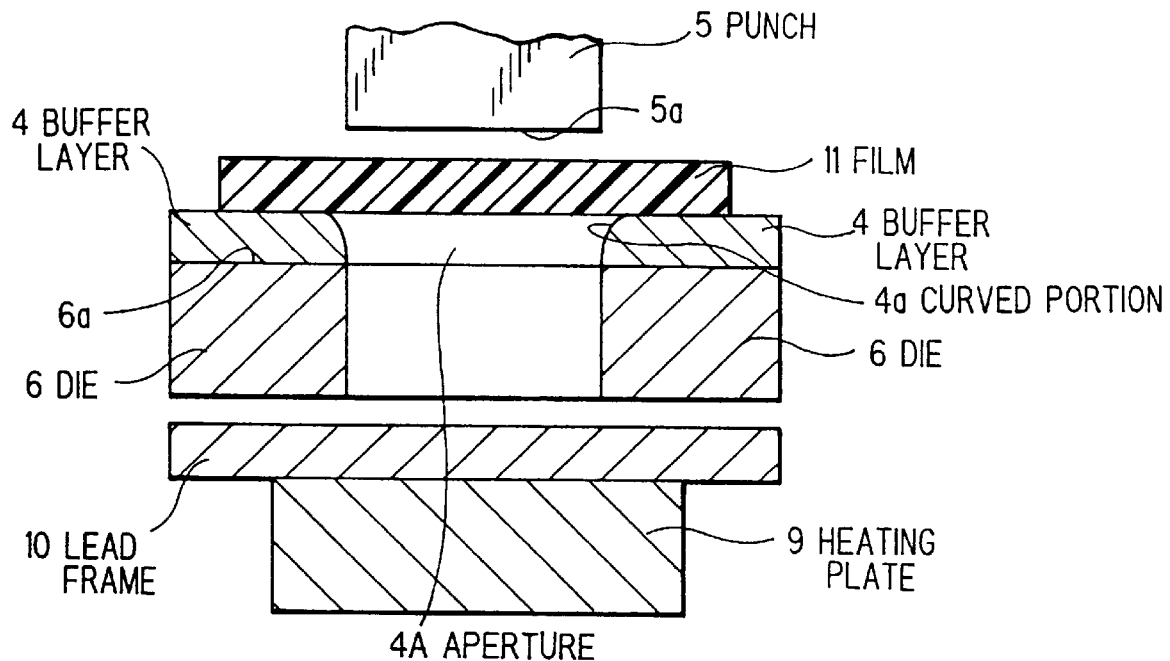
FIG. 4 is a partial cross-sectional view showing an apparatus for sticking a film to a lead frame in a second preferred embodiment according to the invention.
Figure 5:
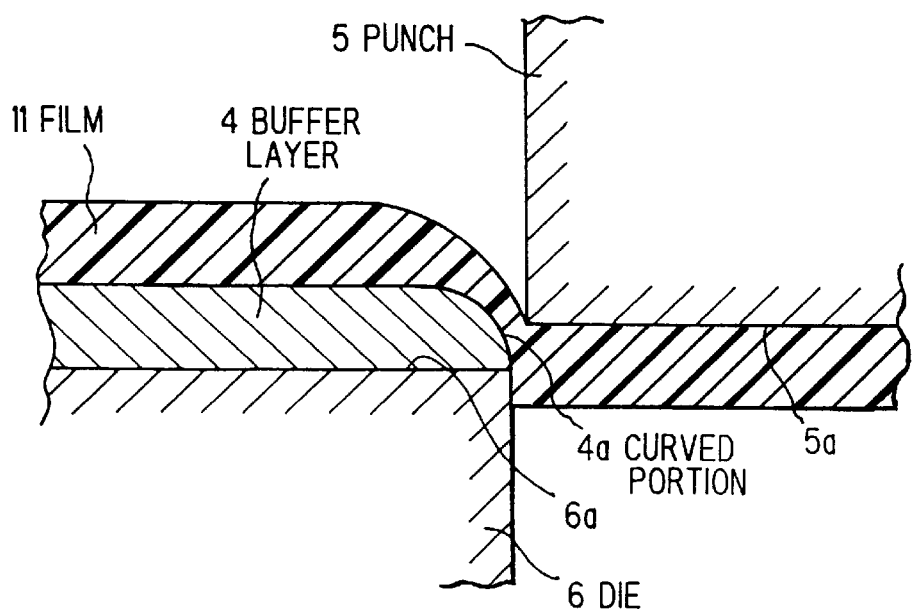
FIG. 5 is an expanded explanatory view showing a film-punching operation by a punch and a die in FIG. 4.

FIG. 4 partially shows an apparatus for sticking a film to a lead frame in the second preferred embodiments, wherein like parts are indicated by like reference numerals as used in FIG. 3. In the second preferred embodiment, the buffer layer 4 is different from the one in the first preferred embodiment in that it is provided with a curved portion 4a on the inner peripheral edge of the aperture 4A thereof. This structure is more effective and practical for relaxing compressive stress more gradually than the structure shown in FIG. 3, then the film 11 is prevented from creating cracks by relaxing compressing stress but increasing tensile stress, as shown in FIG. 5.

It is found by the inventors that the buffer layer 4 may be structured by placing a plate having a predetermined thickness of appropriate material on the die 6, then punching it to be formed with an aperture 4A by the punch 5. It will be understood by those skilled in the art that the buffer layer 4 may be prefabricated to be set on the die 6.

In the above preferred embodiments, the material used as a buffer layer may include nonferrous metals such as aluminum and brass, elastic materials such as hard rubber, and the same synthetic resin as generally used for a film. In the last case, a plate or a film of the synthetic resin is stuck to the top plane 6a of the die 6 and punched by the punch 5 to provide the buffer layer 4 having the aperture 4A. It will be understood by those skilled in the art that a coating layer of paint on the top plane 6a of the die 6 may be used as a buffer layer.

As a film, for example, has a thickness of approximately 30~100 $\mu$m, it is preferable that a buffer layer has a thickness of one fifth to five times that of a film. When it is thinner than that, less relaxation of compressive stress is obtained. If it is thicker than that, difference in size of punched films is likely to occur.

As well explained above, the invention provides an advantage in that compressive stress given to a film by the punch and the die is relaxed by the buffer layer. As a result, creation of cracks on the cutting end of the punched film caused by the excessive compressive stress, burrs or defect of wire-bonding performance derived from the cracks will be eliminated.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for sticking a plastic film to a lead frame, comprising the steps of:

punching said plastic film to provide a punched film by a punch and a die cooperating with each other, said plastic film being placed on a buffer layer, said buffer layer being provided on said die, said punch passing through an aperture in said buffer layer when said punch punches said plastic film;

applying said punched film on a lead frame heated on a heating plate; and compressing said punched film on said lead frame on said heating plate by said punch, said punched film being stuck to said lead frame;

wherein said punching step is carried out in a state where said plastic film is placed on said buffer layer together with a step of relaxing compressive stress added to said plastic film and increasing tensile stress added to said plastic film by said buffer layer as said plastic film is pressed against said buffer layer and toward said die by said punch.

2. A method for sticking a plastic film to a lead frame according to claim 1, wherein said aperture is provided with a curved portion on the inner peripheral edge thereof.

3. A method for sticking a plastic film to a lead frame according to claim 1, wherein:

said buffer layer has a thickness of one fifth to five times that of said plastic film to be punched.

4. A method for sticking a plastic film to a lead frame according to claim 1, wherein:

said buffer layer is made of at least one nonferrous metal.

5. A method for sticking a plastic film to a lead frame according to claim 1, wherein:

said buffer layer is made of at least one elastic material.

6. A method for sticking a plastic film to a lead frame, comprising the steps of:

punching said plastic film to provide a punched film by a punch and a die cooperating with each other, said plastic film being placed on an aluminum buffer layer, said aluminum buffer layer being provided on said die, said punch passing through an aperture in said aluminum buffer layer when said punch punches said plastic film;

applying said punched film on a lead frame heated on a heating plate; and compressing said punched film on said lead frame on said heating plate by said punch to stick said punched film to said lead frame wherein said punching step is carried out in a state where said plastic film is placed on said buffer layer together with a step of relaxing compressive stress added to said plastic film and increasing tensile stress added to said plastic film by said buffer layer as said plastic film is pressed against said buffer layer and toward said die by said punch.

* * * * *